United States Patent
Franz et al.

(10) Patent No.: US 10,356,957 B2
(45) Date of Patent: Jul. 16, 2019

(54) ADAPTIVE COOLING ASSEMBLY

(71) Applicant: HEWLETT PACKARD ENTERPRISE DEVELOPMENT LP, Houston, TX (US)

(72) Inventors: John P Franz, Houston, TX (US); Tahir Cader, Liberty Lake, WA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/523,674

(22) PCT Filed: Oct. 31, 2014

(86) PCT No.: PCT/US2014/063521
§ 371 (c)(1),
(2) Date: May 1, 2017

(87) PCT Pub. No.: WO2016/069010
PCT Pub. Date: May 6, 2016

(65) Prior Publication Data
US 2017/0359923 A1 Dec. 14, 2017

(51) Int. Cl.
H05K 7/04 (2006.01)
H05K 7/14 (2006.01)
H05K 7/20 (2006.01)

(52) U.S. Cl.
CPC ........... H05K 7/20781 (2013.01); H05K 7/04 (2013.01); H05K 7/1457 (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS 6,496,367 B2 * 12/2002 Donahoe ................. G06F 1/203
361/679.46
7,262,962 B1 * 8/2007 McLeod ................... G06F 1/20
361/679.48

(Continued)

FOREIGN PATENT DOCUMENTS

WO WO-2013090862 6/2013
WO WO-2013119243 8/2013

OTHER PUBLICATIONS

"Tyan AMD Open 3.0 Platform (AMD Roadrunner)." Retrieved form Internet Sep. 17, 2014, http://www.tyan.com/solutions/tyan_amd_open_30/tyan_amd_open_3.0_platform.html.
(Continued)

Primary Examiner — Robert J Hoffberg
Assistant Examiner — Razmeen Gafur
(74) Attorney, Agent, or Firm — Hewlett Packard Enterprise Patent Department

(57) ABSTRACT

Example implementations relate to an adaptive cooling assembly. For example, an adaptive cooling assembly includes a removable shelf installed in the adaptive cooling assembly, an adaptive cooling bay located in a slot formed by the removable shelf, and a removable thermal bus bar installed in the adaptive cooling bay and connected to a pair of connectors. The adaptive cooling bay includes the pair of connectors and the removable thermal bus bar provides liquid cooling to an electronic device.

20 Claims, 6 Drawing Sheets

(52) U.S. Cl.
CPC ....... H05K 7/1488 (2013.01); H05K 7/20509 (2013.01); H05K 7/20736 (2013.01)

(58) Field of Classification Search
CPC ... H05K 7/20009–202; H05K 7/20781; H05K 7/04; H05K 7/1488; H05K 7/20509; H05K 7/20736; H01L 23/367–3677; H01L 23/473; H01L 23/46–467; H04K 7/1488
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 7,312,987 B1* | 12/2007 | Konshak | G06F 1/20 165/80.4 |
| 7,369,486 B2 | 5/2008 | Min | |
| 8,000,103 B2* | 8/2011 | Lipp | F28D 1/05316 165/104.33 |
| 8,199,481 B2 | 6/2012 | Sivertsen | |
| 8,300,410 B2* | 10/2012 | Slessman | H05K 7/20745 165/104.33 |
| 8,358,502 B2 | 1/2013 | Gomez | |
| 8,441,793 B2 | 5/2013 | Dunwoody | |
| 8,817,473 B2* | 8/2014 | Babish | H01L 23/473 165/80.4 |
| 8,964,396 B1* | 2/2015 | Dailey | H05K 7/1492 312/223.2 |
| 9,204,576 B2* | 12/2015 | Goulden | H05K 7/20736 |
| 9,335,799 B2* | 5/2016 | Nguyen | G06F 1/181 |
| 9,351,428 B2* | 5/2016 | Eckberg | H05K 7/20772 |
| 9,417,664 B1* | 8/2016 | Dailey | H05K 7/1492 |
| 10,091,913 B2* | 10/2018 | Shimasaki | H05K 7/20254 |
| 2003/0112600 A1* | 6/2003 | Olarig | H05K 7/20581 361/679.48 |
| 2003/0198018 A1* | 10/2003 | Cipolla | G06F 9/52 361/679.48 |
| 2005/0084384 A1* | 4/2005 | Delano | F04D 15/0066 417/42 |
| 2007/0291452 A1* | 12/2007 | Gilliland | H05K 7/20781 361/699 |
| 2008/0092577 A1* | 4/2008 | Martin | G06F 1/206 62/259.2 |
| 2008/0158818 A1* | 7/2008 | Clidaras | G06F 1/206 361/699 |
| 2008/0236981 A1* | 10/2008 | Powers | F01P 7/048 192/84.1 |
| 2009/0126910 A1 | 5/2009 | Campbell | |
| 2009/0159241 A1 | 6/2009 | Lipp | |
| 2010/0128431 A1* | 5/2010 | Eriksen | G06F 1/20 361/679.47 |
| 2011/0013348 A1 | 1/2011 | Seibold | |
| 2011/0194256 A1* | 8/2011 | De Rijck | H01L 23/34 361/717 |
| 2011/0266356 A1* | 11/2011 | Lin | H05B 1/0227 237/2 A |
| 2012/0020008 A1 | 1/2012 | Dunwoody | |
| 2012/0035773 A1* | 2/2012 | Stabinski | F25B 49/025 700/282 |
| 2012/0039036 A1 | 2/2012 | Krause | |
| 2012/0155025 A1* | 6/2012 | Bourgeois | H01M 10/399 361/694 |
| 2012/0279686 A1* | 11/2012 | Chainer | H05K 7/20772 165/104.21 |
| 2013/0077238 A1* | 3/2013 | Babish | H01L 23/473 361/689 |
| 2013/0204984 A1 | 8/2013 | Meyer | |
| 2013/0299139 A1* | 11/2013 | Mounioloux | F28D 1/04 165/120 |
| 2013/0322016 A1* | 12/2013 | Jones | H05K 7/1432 361/689 |
| 2014/0035562 A1* | 2/2014 | Huang | G01P 3/489 324/166 |
| 2014/0054024 A1* | 2/2014 | Chen | H05K 7/20836 165/247 |
| 2014/0078668 A1* | 3/2014 | Goulden | H05K 7/20736 361/679.47 |
| 2014/0124169 A1* | 5/2014 | Kelaher | H05K 7/20727 165/86 |
| 2014/0181562 A1* | 6/2014 | Das | G06F 1/206 713/324 |
| 2015/0160702 A1* | 6/2015 | Franz | G06F 1/20 361/679.47 |
| 2015/0189787 A1* | 7/2015 | Bailey | H05K 7/1489 361/679.48 |
| 2015/0208551 A1* | 7/2015 | Davidson | H05K 7/20781 165/80.2 |
| 2015/0285524 A1* | 10/2015 | Saunders | F24F 7/065 454/239 |
| 2015/0359131 A1* | 12/2015 | Moore | H05K 7/1488 211/26 |
| 2015/0359132 A1* | 12/2015 | Campbell | H05K 7/20236 361/700 |
| 2015/0382499 A1* | 12/2015 | Chiasson | G11B 33/124 361/679.33 |
| 2016/0088766 A1* | 3/2016 | Bell | G11B 33/128 361/679.48 |
| 2016/0104101 A1* | 4/2016 | Lambert | G06Q 10/087 705/28 |
| 2016/0356478 A1* | 12/2016 | Harris | F21V 23/0442 |
| 2018/0242478 A1* | 8/2018 | Cui | H05K 7/20772 |

OTHER PUBLICATIONS

PCT/ISA/KR, International Search Report, dated Jan. 2015, PCT/US2014/063521.

* cited by examiner

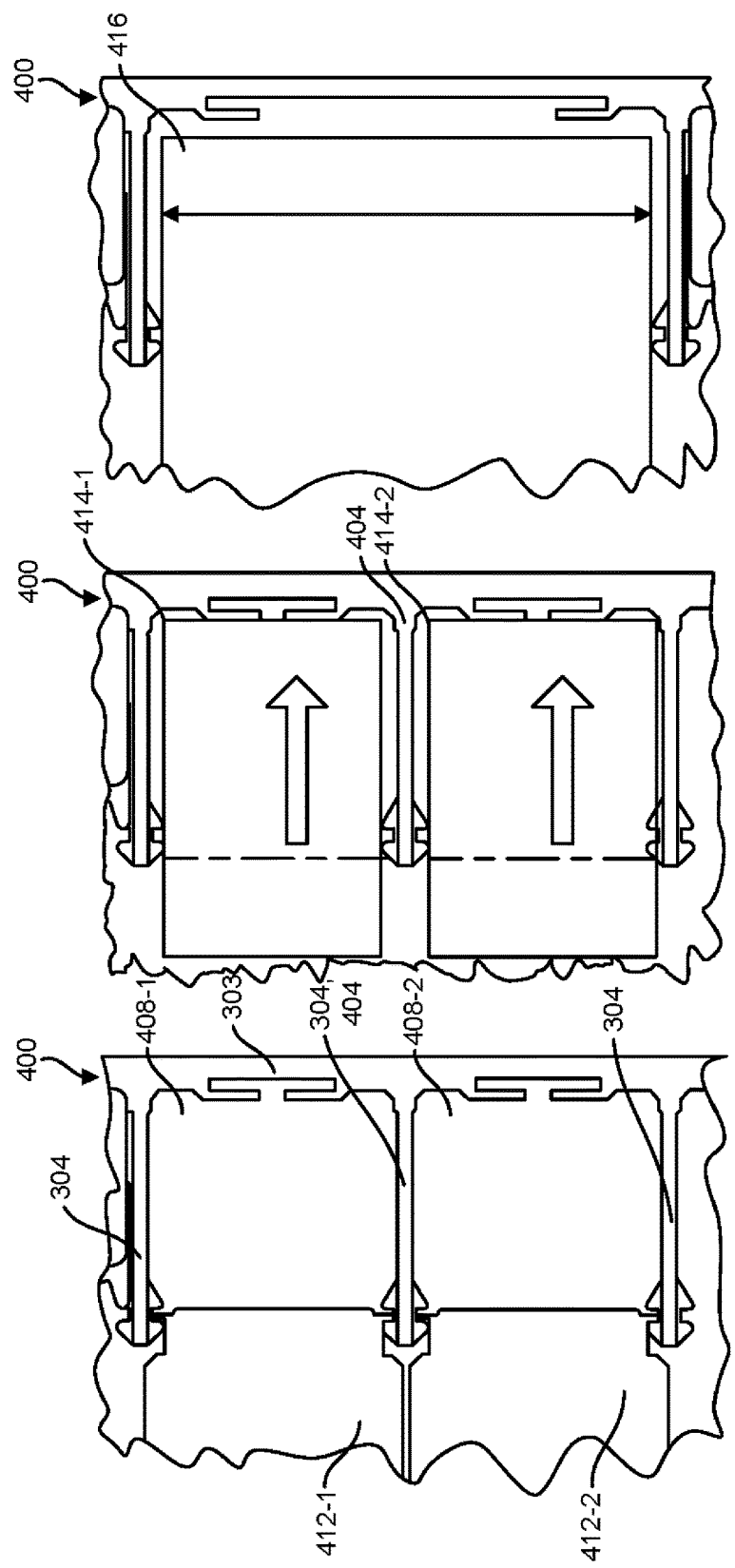

ADAPTIVE COOLING ASSEMBLY

BACKGROUND

Electronic devices can have temperature limitations. For example, an electronic device can malfunction if the temperature of the electronic device reaches or exceeds a threshold temperature. Heat from the use of the electronic devices can be controlled using cooling systems. Example cooling systems include air and liquid cooling systems.

BRIEF DESCRIPTION OF THE DRAWINGS

FIG. 4 illustrates an example of a process of revising an adaptive cooling assembly according to the present disclosure;

DETAILED DESCRIPTION

Figure 1:
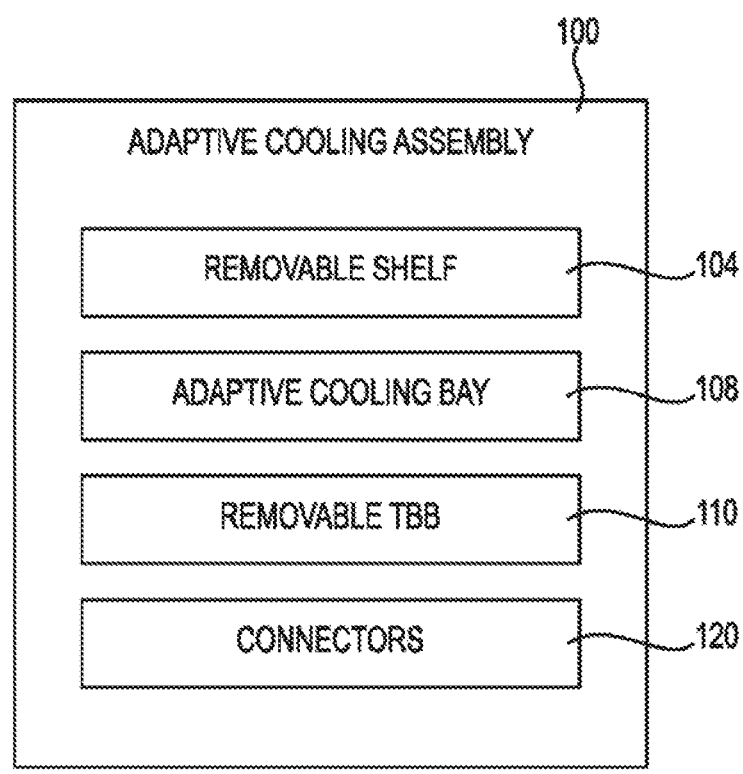
FIG. 1 illustrates a diagram of an example of n adaptive cooling assembly according to the present disclosure.

Electronic systems can be designed to balance conflicts between power density, spatial layout, temperature requirements, acoustic noise, and other factors. Air cooling systems can use heat sinks and fans to remove "waste" heat from the system. The use of heat sinks and fans increase the electrical power to operate the server device and/or system, and may cause excessive acoustic noise and lower system density. Liquid cooling can be more efficient than air cooling; however, liquid cooling typically includes plumbing connections within the server devices. As the liquid goes through the plumbing connections, the risk of leakage of the liquid within the server device is introduced.

Liquid leakage can cause damage to the server devices. For example, liquid leaked can cause a server device to malfunction and/or terminate. To reduce damage, a dielectric fluid can be used and/or the liquid may be near the circuit but not in contact. However, dielectric fluids are expensive compared to other liquids, are hazardous (e.g., safety issues in handling and limitation in how to dispose of the liquid), and their thermal performance is lower than other liquids, such as water.

A cooling assembly can be used to have the liquid rear but not in contact with the electronic device. The cooling assembly can include a wall structure with a plurality of thermal bus bars (TBB) to carry fluid there through. A thermal bus bar, as used herein, can include a (rectangular) part that is filled with a number of fluid channels that allow cooling fluid to be pumped from a cooling base. A cooling base can include an enclosure that holds piping, pumps, and/or heat exchangers for the TBBs. Heat from the electronic devices can transfer to the cooling assembly via a dry disconnect. The cooling assembly is outside of the electronic device to enable the liquid cooling to occur away from the electronic devices.

In some instances, a customer and/or other personnel may want to revise a cooling assembly to provide a variety of server solutions and capabilities. However, the cooling assembly is fixed in dimensions and in a type of cooling used, which can make it difficult to revise the cooling assembly. For example, a customer may have a variety of electronic devices installed in a rack. Only a portion of the electronic devices may use liquid cooling, and the customer may want to use a different cooling mechanism for the remaining electronic devices. Further, some electronic devices may be larger in size than others. It may be difficult to install the larger electronic device due to the fixed dimensions of the cooling assembly. And, as technology advances, a customer may like to install a new TBB that has greater cooling abilities and/or other advantages.

Examples in accordance with the present disclosure can include an adaptive cooling assembly that can allow a user (e.g., a customer) to revise the cooling assembly to support different types of cooling, different electronic devices, and to service and/or replace TBBs. The adaptive cooling assembly can include a removable shelf that is installed in the adaptive cooling assembly and an adaptive cooling bay located in a slot formed by the removable shelf. The adaptive cooling bay can include a space for cooling equipment and/or other electronic devices and a pair of connectors to support a variety of cooling equipment. A removable TBB can be installed in the adaptive cooling bay. The removable TBB can be connected to the pair of connectors in the adaptive cooling bay. The removable TBB can provide liquid cooling to an electronic device installed in the rack that the adaptive cooling assembly is installed in.

The TBB and/or shelf can be removed. For example, the TBB can be removed to service the TBB and/or to replace it with an upgraded TBB. In some examples, the TBB can be removed to support an electronic device of a greater width than can be supported with the TBB installed. Further, the TBB can be removed to allow for different cooling techniques, such as air cooling and/or integrated liquid-cooled cold plate cooling.

The shelf can be removed to support an electronic device of a greater height than can be supported with the shelf installed. For example, each TBB can have a height of 1 rack unit (U). The shelf can be removed to support an electronic device with a height of 2U.

As used herein, a rack can include a frame (e.g., metal) that can contain a plurality of servers and/or chassis stacked one above one another. A server can refer to a rack server, a blade server, a server cartridge, a chassis, a rack, and/or individual loads. A rack server can include a computer that is used as a server and designed to be installed in a rack. A blade server can include a thin, modular electronic circuit board that is housed in a chassis and each blade is a server. A server cartridge, as used herein, can include a frame (e.g., a case) substantially surrounding a processor, a memory, and a nonvolatile storage device coupled to the processor.

A chassis can include an enclosure which can contain multiple blade servers and provide services such as power, cooling, networking, and various interconnects and management.

FIG. 1 illustrates a diagram of an example of an adaptive cooling assembly 100 according to the present disclosure.

As illustrated by FIG. 1, the adaptive cooling assembly 100 can include a removable shelf 104 installed in the adaptive cooling assembly 100. A removable shelf, as used herein, is a support for holding an object that can be removed from the adaptive cooling assembly 100. The removable shelf 104 can include a flat horizontal surface, for instance.

For example, the adaptive cooling assembly 100 can include a wall structure, and the removable shelf 104 can be installed on the wall structure. The wall structure can include a support for holding the removable TBBs and/or removable shelves. In some examples, the wall structure can include a frame that can be installed and/or is installed in the rack. The wall structure can be perpendicular to the removable shelf 104 (e.g., vertical). In various examples, the wall structure can include connectors for the TBBs and/or other of fluid channels that allow cooling fluid to be pumped from a cooling base to the TBBs, as discussed further herein.

The removable shelf 104 can form a slot. For example, a slot can include a space designed to hold a unit of equipment. For instance, an electronic device can be installed in a slot. The slot formed by the removable shelf 104 can also include an adaptive cooling bay 108. That is, the adaptive cooling bay 108 can be located in a slot formed by the removable shelf 104.

An adaptive cooling bay 108, as previously discussed, can include a space designed to hold cooling equipment and/or other devices. For example, a removable TBB 110 can be installed in the adaptive cooling bay 108. The removable TBB 110 can provide liquid cooling to an electronic device. For instance, the electronic device can be installed in the slot formed by the removable shelf 104 when the adaptive cooling assembly 100 and the electronic device are installed in a rack.

The adaptive cooling bay 108 can include a pair of connectors 120. For example, a connector can include a connection point between inlet and/or outlet channels and the removable TBB 110 and/or an electronic device, such as an electronic device with integrated cooling. A pair (two) of connectors 120 in the adaptive cooling bay 108 can connect to the particular removable TBB 110.

The pair of connectors can include blind mate connectors and/or manual quick connectors. Blind mate connectors, sometimes referred to as "blind mate dripless connectors", can include connectors that can translate (horizontally) to remove a gap between an electronic device and a TBB and/or to connect to an electronic device with integrated cooling, as discussed further herein. That is, a blind mate connector can connect (e.g., mate) with a TBB and/or an electronic device without and/or with reduced manual human interaction (as compared to a manual quick connector). A manual quick connector, by contrast, can include connectors that are manually connected to a removable TBB and/or other electronic device. Both a blind mate connector and a manual quick connector can be dripless. As discussed further with regards to FIG. 5, the pair of blind mate connectors 120 can be used to support an upgraded removable TBB and/or other cooling equipment (e.g., an electronic device with an integrated liquid-cooled cold plate).

The removable TBB 110 and/or the removable shelf 104 can be removed from the adaptive cooling assembly 100, in various examples, to provide a variety of server solutions and performance options. For example, the removable TBB 110 can be removed to install an electronic device that is a greater width than can be installed with the removable TBB 110 installed. Alternatively and/or in addition, the removable TBB 110 can be removed to provide a different type of cooling to an installed electronic device, such as air cooling and/or integrated liquid-cooled cold plate cooling. Further, the removable TBB 110 can be removed to service the removable TBB 110 and/or to replace the removable TBB 110 with an upgraded TBB, such as higher performance materials, flow control, thermal interface, etc.

The removable shelf 104 can be removed to install an electronic device that is a greater height than can be installed with the removable shelf 104 installed. For example, as further illustrated by FIG. 2, the adaptive cooling assembly 100 can be of a particular dimension and the removable shelf 104 can be installed at a particular height of the wall structure.

Figure 2:
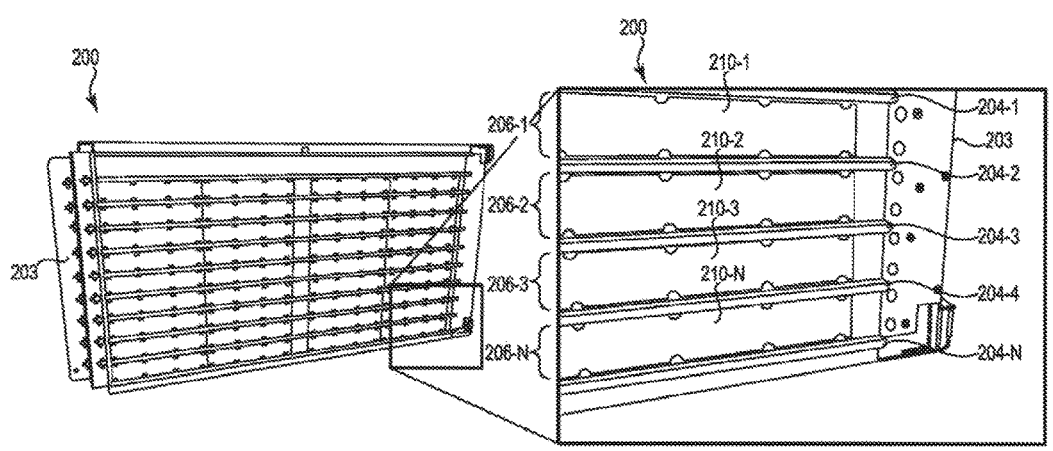
FIG. 2 illustrates a diagram of an example of an adaptive cooling assembly according to the present disclosure.

FIG. 2 illustrates a diagram of an example of an adaptive cooling assembly 200 according to the present disclosure. The adaptive cooling assembly 200 illustrated by FIG. 2 can include the same and/or a different assembly than the adaptive cooling assembly 100 illustrated by FIG. 1.

The adaptive cooling assembly 200 can include wall structure 203 and a plurality of removable shelves 204-1, 204-2, 204-3, 204-4, 204-N (herein generally referred to as removable shelves 204). The adaptive cooling assembly 200 can be, for example, installed in a rack and electronic devices can be installed in the rack in thermal contact with the adaptive cooling assembly 200. For example, an electronic device can be in thermal contact with a particular removable TBB.

The wall structure 203, in some examples, can be of a particular height, and the removable shelves 204 can be installed at incremental heights along the wall structure 203. For example, the wall structure can be a height of 10U and the removable shelves 204 can be installed at 1U increments.

As illustrated by the exploded view of FIG. 2, the removable shelves 204 can form a plurality of slots 206-1, 206-2, 206-3, 206-N. A removable TBB can be installed in an adaptive cooling bay of one of the plurality of slots to provide liquid cooling to an electronic device. The adaptive cooling bay can include a pair of connectors (not illustrated by FIG. 2) and the removable TBB installed in the adaptive cooling bay can be connected to the pair of connectors. For example, as illustrated by FIG. 2, a plurality of removable TBBs 210-1, 210-2, 210-3, 210-N (herein after referred to as the removable TBBs 210) can be installed in at least a subset of the plurality of adaptive cooling bays to provide liquid cooling to a subset of a plurality of electronic devices.

In a number of examples, each of the plurality of adaptive cooling bays can include a pair of connectors to support removable TBBs, to allow for upgrading the removable TBBs, and/or to support alternative cooling techniques, as discussed further herein. For example, each adaptive cooling bay can include a pair of blind mate connectors located at the back and/or front of the wall structure 203. A removable TBB installed in a respective adaptive cooling bay can connect to the pair of blind mate connectors located in the respective adaptive cooling bay. Liquid can be provided to and removed from the removable TBB using the blind mate connectors.

The removable TBBs 210 can be installed laterally along the wall structure 203. For example, the wall structure 203 can include a vertical support (e.g., frame) and the removable shelves 204 can be removably attached to the wall structure 203. The removable shelves 204 can extend out from the wall structure 203 in a direction that is perpendicular to the wall structure 203. For example, the removable shelves 204 can extend out from the wall structure 203 in a horizontal direction to create a flat horizontal surface. The removable shelves 204 can form the adaptive cooling bays (e.g., a space designed to hold cooling equipment and/or other devices). The removable TBBs 210 can be slid into the adaptive cooling assembly in the adaptive cooling bays. For example, the removable TBBs 210 can be positioned laterally along the wall structure 203 and can extend the length of the removable shelves 204. The removable TBBs 210 can, for instance, extend in a parallel direction to the direction that the removable shelves 204 extend. The removable TBBs 210 can connect to a pair of connectors at the back (or front) of the adaptive cooling assembly 200 (e.g., the wall structure) in the adaptive cooling bay, as further discussed herein, to provide liquid to the removable TBBs 210.

Figure 3A:
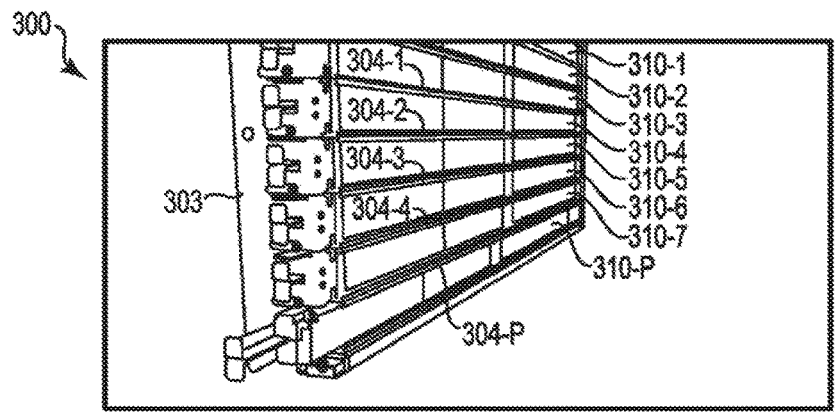
FIGS. 3A-3C illustrate an example of a process of revising an adaptive cooling assembly according to the present disclosure.
Figure 3B:
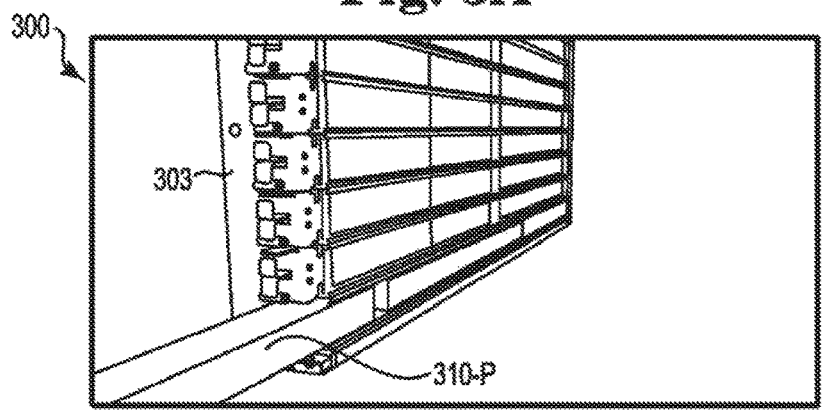
Figure 3C:
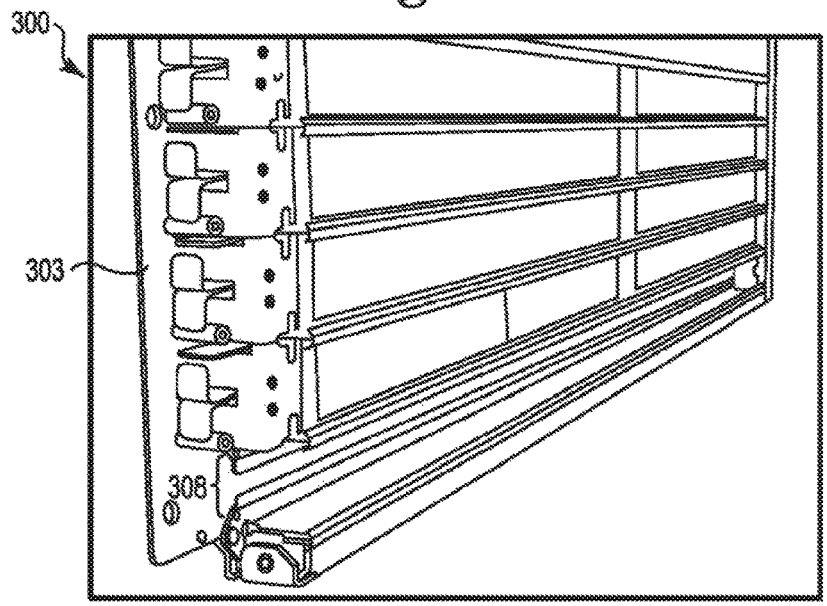

FIGS. 3A-3C illustrate an example of a process of revising an adaptive cooling assembly according to the present disclosure. For example, FIGS. 3A-3C illustrate removing a particular removable TBB 310-P from an adaptive cooling assembly 300.

The adaptive cooling assembly 300 illustrated by FIGS. 3A-3C can include a wall structure 303 and a plurality of shelves 304-1, 304-2, 304-3, 304-4, 304-P. A plurality of removable TBBs 3101, 310-2, 310-3, 310-4, 310-5, 310-8, 310-7, 310-P can be installed in an adaptive cooling bay of a slot formed by the plurality of shelves 304-1, 304-2, 304-3, 304-4, 304-P. The adaptive cooling bay can include a pair of connectors (located at the back or front of the wall structure 303).

FIGS. 3A and 3B illustrate a particular removable TBB 310-P being removed from the adaptive cooling assembly 300. For example, FIG. 3A illustrates the beginning of the removal of the particular removable TBB 310-P and FIG. 3B illustrates the particular removable TBB 310-P being slid out of the adaptive cooling bay.

FIG. 3C illustrates an empty adaptive cooling bay 308 formed in the slot. An empty adaptive cooling bay, as used herein, is an adaptive cooling bay without cooling equipment and/or other devices in the bay.

The particular removable TBB 310-P, as illustrated by FIGS. 3A-3B, that is removed can be serviced, replaced with an upgraded TBB, replaced with an electronic device with an integrated liquid-cooled cold plate, and/or the adaptive cooling bay 308 can remain empty. For example, an electronic device installed in a slot associated with the adaptive cooling bay 308 that is empty can be cooled using air cooling, can include an electronic device with integrated cooling and/or can include an electronic device that is wider than can be supported with a removable TBB in the adaptive cooling bay 308, as further illustrated by FIG. 4.

An electronic device with integrated cooling can include an electronic device with an integrated liquid-cooled cold plate and/or other liquid cooling techniques integrated into the electronic device. For example, an electronic device with integrated cooling can include a system on chip (SoC) or three-dimensional (3D) integrated package. The SoC or 3D integrated package installed can have integrated liquid cooling. An electronic device with integrated liquid-cooled cold plate can include a cold plate located within the electronic device, as discussed further herein.

FIG. 4 illustrates an example of a process of revising an adaptive cooling assembly 400 installed in a rack according to the present disclosure.

For example, the adaptive cooling assembly 400 illustrated by the left portion of FIG. 4 includes two electronic devices 412-1, 412-2 in a slot of a rack that is formed by removable shelves (e.g., particular removable shelf 404) of the adaptive cooling assembly 400.

Further, the adaptive cooling assembly 400 includes two adaptive cooling bays 408-1, 408-2 each in a slot of the rack formed by the removable shelves. As illustrated by FIG. 4, the electronic devices 412-1, 412-2 are in proximity to the adaptive cooling bays 408-1, 408-2 of the adaptive cooling assembly 400 when the adaptive cooling assembly 400 is installed in a rack.

A removable TBB can be installed in an adaptive cooling bay and/or a plurality of adaptive cooling bays 408-1, 408-2 to provide liquid cooling to the electronic devices 412-1, 412-2 installed in the slots associated with the adaptive cooling bays 408-1, 408-2. For example, a first electronic device 412-1 can be installed in a first slot, and a first removable TBB can be installed in the first adaptive cooling bay 408-1. The first removable TBB can provide liquid cooling to the first electronic device 412-2.

In some examples, no cooling equipment may be installed in one (or more) of adaptive cooling bays 408-1, 408-2 of an adaptive cooling assembly 400, as illustrated by the middle portion of FIG. 4. For example, a first removable TBB or a second removable TBB can be removed from the first adaptive cooling bay 408-1 or the second adaptive cooling bay 408-2. An electronic device can be installed in a slot with an empty adaptive cooling bay that has a greater width than can be installed with cooling equipment in the adaptive cooling bay.

For example, a first electronic device 412-1 can be removed from the first slot. The first adaptive cooling bay 408- in the first slot can remain empty and/or a second electronic device 414-1 can be installed that has a greater width than the first electronic device 412-1. Similarly, a third electronic device 412-2 can be removed from the second slot and a fourth electronic device 414-2 that has a greater width than the third electronic device 412-2 can be installed in the second slot. The second electronic device 414-1 and/or fourth electronic device 414-2 can be cooled using air cooling, for example.

Further, as illustrated by the adaptive cooling assembly 400 on the right portion of FIG. 4, a removable shelf 404 (as illustrated by the left and middle portion of FIG. 4) of the adaptive cooling assembly 400 can be removed to support an electronic device that has a greater height than can be supported with the removable shelf 404 installed. For example, the removable shelf 404 can be removed to support a second electronic device (e.g., electronic device 416) that is a greater height than the first electronic device (e.g., electronic device 408-1, 408-2, 414-1, and 414-2). The second electronic device 416 can be cooled using air cooling and/or can include an integrated liquid-cooled cold plate.

An adaptive cooling assembly and/or a system in accordance with the present disclosure can include a plurality of removable shelves installed in a wall structure forming a plurality of adaptive cooling bays located in a slot of the rack. A plurality of electronic devices can be installed in one of a plurality of slots in proximity with the adaptive cooling bays (e.g., in thermal contact with cooling equipment installed in the adaptive cooling bays). At least a subset of the plurality of adaptive cooling bays can have a removable TBB installed therein to provide liquid cooling to at least a subset of the plurality of electronic devices.

In various examples, at least one of the plurality of shelves can be removed to support a different electronic device of a greater height then the plurality of electronic devices. For example, the plurality of electronic devices can have a height of 1U and the different electronic device can have a height of 2U or 1.5U.

Further, a first adaptive cooling bay of a first slot can include a first removable TBB installed therein and a second adaptive cooling bay of a second slot may not include a second removable TBB installed therein. For example, the second removable TBB can be removed from the second adaptive cooling bay and/or is not installed in the first place. The second slot can support a different electronic device that is of a greater width than one of the plurality of electronic devices.

The different electronic devices (of a greater width and/or height) can be cooled using integrated cooling (e.g., liquid-cooled cold plate cooling) and/or air cooling. For example, integrated liquid-cooled cold plate cooling can be supported using connectors (e.g., blind mate connectors as illustrated and discussed further in regards to FIG. 5).

Figure 5:
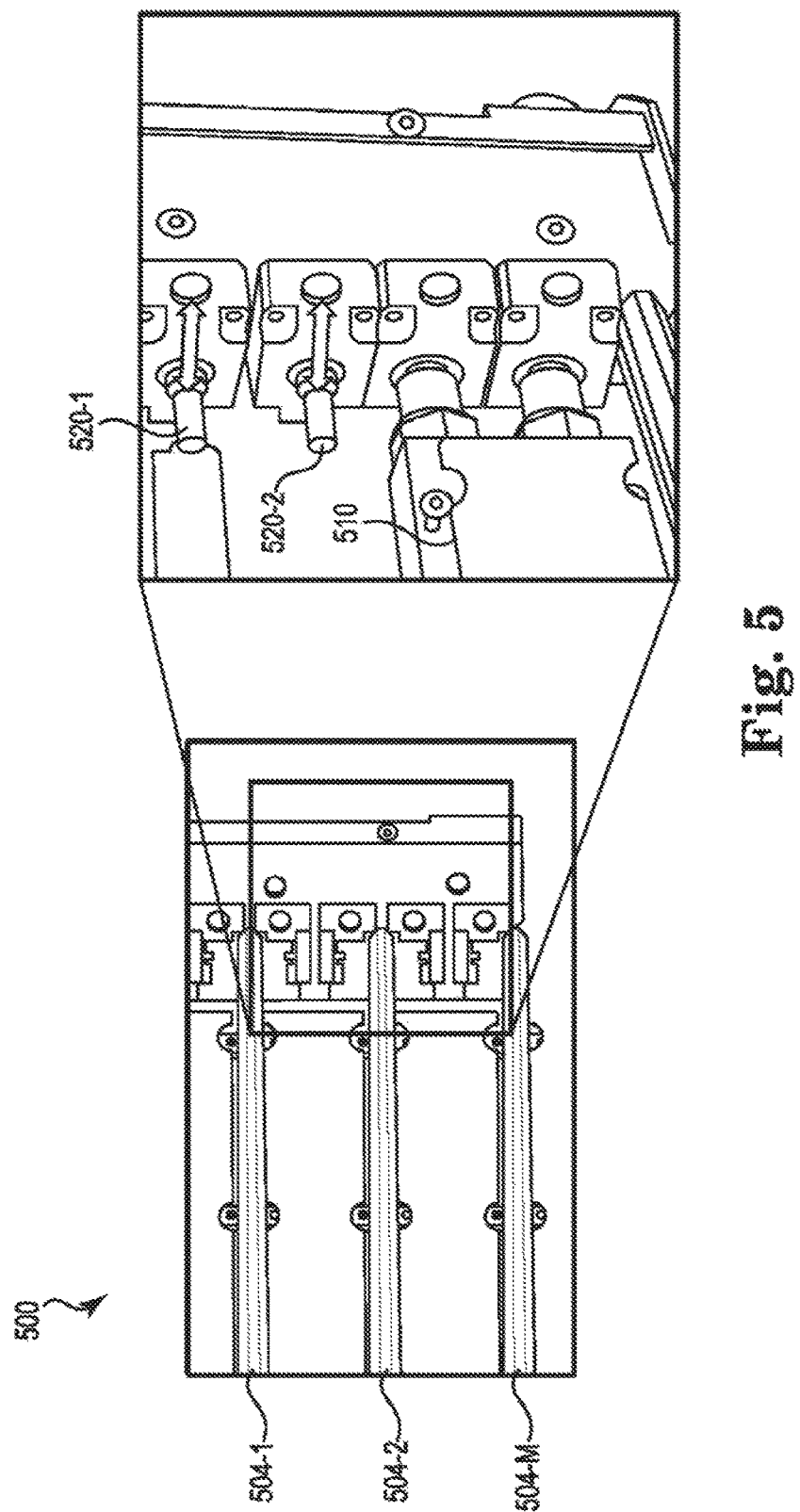
FIG. 5 illustrates a diagram of an example of a pair of blind mate connectors on an adaptive cooling assembly according to the present disclosure.

FIG. 5 illustrates a diagram of an example of a pair of blind mate connectors 520-1, 520-2 on an adaptive cooling assembly 500 according to the present disclosure. The adaptive cooling assembly 500 can include the same adaptive cooling assemblies 100, 200, 300, 400, illustrated by FIGS. 1, 2, 3, and 4 in some examples. The pair of blind mate connectors 520-1, 520-2 can be used to support a removable TBB and/or an electronic device with integrated cooling.

The adaptive cooling assembly 500 can include a plurality of shelves 504-1, 504-2, 504-M forming a plurality of adaptive cooling bays. A removable TBB can be installed in at least a subset of the plurality of adaptive cooling bays to provide liquid cooling to electronic devices. For example, a removable TBB is illustrated as being installed in each of the plurality of adaptive cooling bays.

As illustrated by the exploded view of FIG. 5, the adaptive cooling assembly 500 can include a pair of blind mate connectors at the back or front of the adaptive cooling assembly 500 (e.g., the back or front of the wall structure) in the adaptive cooling bay. A front of the adaptive cooling assembly can include a side of the adaptive cooling assembly that the removable TBBs and/or other cooling equipment are installed in. The back of the adaptive cooling assembly, as used herein, can include an opposite side of the front of the adaptive cooling assembly.

For example, two blind mate connectors can be located at the back and/or front of the adaptive cooling assembly 500 in each adaptive cooling bay. The pair of blind mate connectors in each adaptive cooling bay can include connection points between inlet and outlet channels and the removable TBBs and/or other electronic devices with integrated cooling. For example, two blind mate connectors can connect to the particular removable TBB 510.

A gap between the electronic device and the removable TBB can exist in some instances. However, in order to cool the electronic device using the removable TBB, a thermal contact can be created. The blind mate connectors (e.g., blind mate connectors 520-1, 520-2) can translate in a horizontal direction relative to the removable TBB and/or the electronic device to remove the gap and to create a thermal contact between the electronic device and the removable TBB. The horizontal direction can include a left or a right direction, in some examples. For example, the translation can include a direction that is parallel to the direction that the removable shelves extend out from the wall structure.

Further, the blind mate connectors can be used to support an electronic device with integrated cooling. Example electronic devices with integrated cooling can include an electronic device with an integrated liquid-cooled cold plate, and/or SoC or a three-dimensional integrated packet with integrated liquid cooling, among other devices. An integrated liquid-cooled cold plate can include a cold plate located within the electronic device. Cold liquid can be circulated through the liquid-cooled cold plate to remove heat from the heat-emitting components of the electronic device. A heat exchanger can be coupled to the liquid-cooled cold plate. The blind mate connectors can be used to connect the integrated liquid-cooled cold plate to a liquid source and/or the cooling base, as previously discussed.

Figure 6:
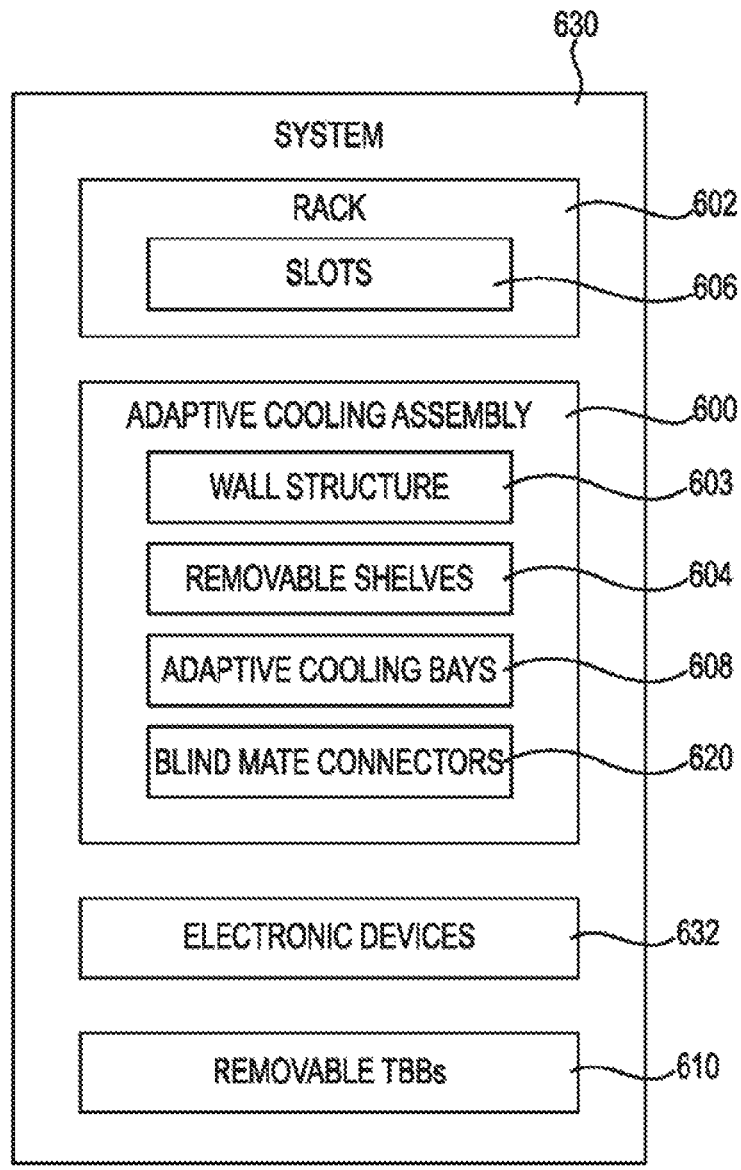
FIG. 6 illustrates a diagram of an example of a system according to the present disclosure.

FIG. 6 illustrates a diagram of an example of a system 630 according to the present disclosure. For example, the system 630 can include a rack 602 with a plurality of slots 606 to support a plurality of electronic devices 632.

As previously discussed, an adaptive cooling assembly 600 can be installed in the rack 602. For example the adaptive cooling assembly 600 can include a wall structure 603 and a plurality of removable shelves 604 on the wall structure 603 forming a plurality of adaptive cooling bays 608. Each adaptive cooling bay can be located in and/or associated with one of the plurality of slots 606 and each adaptive cooling bay can include a pair of blind mate connectors 620.

Further, the system 630 can include a plurality of electronic devices 632. Each of the plurality of electronic devices can be installed in one of the plurality of slots 606 and can be supported by at least one of the plurality of removable shelves 604.

A plurality of TBBs 610 can be installed in the adaptive cooling assembly 600. For example, the plurality of removable TBBs 610 can be installed in at least a subset of the plurality of adaptive cooling bays 608. A plurality of removable TBBs installed in at least a subset of the plurality of adaptive cooling bays 608, as used herein, refers to a single removable TBB installed in each of the at least subset of the plurality of adaptive cooling bays 608.

An installed removable TBB 610 can be connected to a pair of the blind mate connectors 620. That is, each removable TBB 610 installed can be connected to one of the pairs of blind mate connectors 620. The removable TBBs 610 and/or blind mate connectors 620 can provide liquid cooling to at least a subset of the plurality of electronic device 632.

The rack 602 in accordance with some examples can include a height of 10U and each of the plurality of slots 606 can include a height of 1U. Further, one of the plurality of removable shelves 604 can be removed to support a different electronic device of a greater height than 1U.

In some examples, as previously discussed, at least one of the plurality of adaptive cooling bays 608 may not include a removable TBB installed therein. For example, an electronic device installed in a slot associated with the one adaptive cooling bay may be air cooled and/or integrated liquid cooled.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. Further, as used herein, "a number of" an element and/or feature can refer to one or more of such elements and/or features.

What is claimed:

1. An adaptive cooling assembly, comprising:
   a pair of removable shelves installed in the adaptive cooling assembly and defining an adaptive cooling bay including a pair of liquid cooling connectors; and
   a removable thermal bus bar (TBB) including a plurality of fluid channels that allow a cooling fluid to be pumped therethrough installed in the adaptive cooling bay, connected to the pair of liquid cooling connectors, and configured to provide liquid cooling to an electronic device in thermal contact therewith.

2. The adaptive cooling assembly of claim 1, wherein the pair of liquid cooling connectors comprises a pair of blind mate connectors located at a back of the adaptive cooling assembly or a front of the adaptive cooling assembly.

3. The adaptive cooling assembly of claim 1, wherein the pair of liquid cooling connectors comprises a pair of manual quick connectors.

4. The adaptive cooling assembly of claim 1, wherein:
   the pair of removable shelves define a second adaptive cooling bay including a second pair of liquid cooling connectors; and
   a second electronic device disposed within the second adaptive cooling bay, the second electronic device including integrated liquid cooling and connected to the second pair of liquid cooling connectors.

5. The adaptive cooling assembly of claim 4, wherein the integrated liquid cooling includes a liquid-cooled cold plate.

6. The adaptive cooling assembly of claim 4, wherein the second electronic device is a system on chip device or a three-dimensional integrated package.

7. A system comprising:
   an adaptive cooling assembly including:
      a wall structure;
      a plurality of removable shelves installed on the wall structure forming a plurality of slots; and
      a plurality of liquid cooling connectors in at least one of the slots; and a removable thermal bus bar (TBB) including a plurality of fluid channels that allow a liquid to be pumped therethrough installed in the at least one slot and connecting to the liquid cooling connectors to provide liquid cooling to an electronic device in thermal contact therewith.

8. The system of claim 7, wherein at least one of the plurality of slots is larger than at least one of the other slots by omission of a removable shelf to support a different electronic device of a greater height than the electronic device.

9. The system of claim 7, wherein the plurality of slots further includes a second slot that does not include a second removable TBB, wherein the second slot supports a different electronic device of a greater width than the electronic device.

10. The system of claim 9, wherein the second slot includes a pair of liquid cooling connectors that the different electronic device is connected to such that the different electronic device is cooled using the liquid received from the liquid cooling connectors.

11. The system of claim 7, wherein the plurality of liquid cooling connectors comprises a pair of blind mate connectors at a back or a front of the wall structure and the pair of blind mate connectors support both the removable TBB and an integrated cooling electronic device.

12. The system of claim 7, further comprising:
   a second one of the slots including a pair of the liquid cooling connectors; and
   a second electronic device disposed within the second slot, the second electronic device including integrated liquid cooling and connected to the second pair of liquid cooling connectors.

13. The system of claim 12, wherein the integrated liquid cooling includes a liquid-cooled cold plate.

14. The system of claim 12, wherein the second electronic device is a system on chip device or a three-dimensional integrated package.

15. A system comprising:
   a rack including a plurality of slots to support a plurality of electronic devices;
   an adaptive cooling assembly within the rack, the adaptive cooling assembly including:
      a wall structure; and
      a plurality of removable shelves forming a plurality of adaptive cooling bays, wherein
      each of the plurality of adaptive cooling bays includes a pair of blind mate connectors;
   the plurality of electronic devices, each installed in one of the plurality of adaptive cooling bays and supported by at least one of the plurality of removable shelves; and
   a plurality of removable thermal bus bars (TBB), each TBB including a plurality of fluid channels that allow a cooling fluid to be pumped therethrough, installed in at least a subset of the plurality of adaptive cooling bays, each TBB in thermal contact with at least one of the electronic devices to provide liquid cooling to at least a subset of the plurality of electronic devices, wherein each of the plurality of removable TBBs are connected to one of the pairs of blind mate connectors.

16. The system of claim 15, wherein:
   at least one of the plurality of adaptive cooling bays does not include at least one of the removable TBBs installed therein, and
   one of the electronic devices installed in one of the plurality of slots associated with the one adaptive cooling bay is cooled using air cooling.

17. The system of claim 15, wherein the rack includes a height of 10 rack units and each of the plurality of slots include a height of 1 rack unit, wherein one of the plurality of removable shelves is removed to support a different electronic device of a greater height than 1 rack unit.

18. The system of claim 15, wherein the electronic devices comprise a liquid-cooled electronic device including integrated liquid cooling, disposed within a respective one of the adaptive cooling bays, and connected to the pair of the blind mate connectors in the respective one of the adaptive cooling bays.

19. The system of claim 18, wherein the integrated liquid cooling includes a liquid-cooled cold plate.

20. The system of claim 18, wherein the second electronic device is a system on chip device or a three-dimensional integrated package.

* * * * *